(12) United States Patent
Sahu et al.

(10) Patent No.: US 9,019,685 B2
(45) Date of Patent: Apr. 28, 2015

(54) INDUCTOR COMPRISING ARRAYED CAPACITORS

(75) Inventors: Satyajit Sahu, Tsukuba (JP); Anirban Bandyopadhyay, Tsukuba (JP); Daisuke Fujita, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 221 days.

(21) Appl. No.: 13/641,764

(22) PCT Filed: Apr. 14, 2011

(86) PCT No.: PCT/JP2011/059308
§ 371 (c)(1),
(2), (4) Date: Jan. 2, 2013

(87) PCT Pub. No.: WO2011/132597
PCT Pub. Date: Oct. 27, 2011

(65) Prior Publication Data
US 2013/0106538 A1    May 2, 2013

(30) Foreign Application Priority Data
Apr. 19, 2010   (JP) .................................. 2010-096217

(51) Int. Cl.
| | | |
|---|---|---|
| H01H 47/00 | (2006.01) |
| H03H 7/00 | (2006.01) |
| H01F 17/00 | (2006.01) |
| H01G 4/38 | (2006.01) |
| H01G 4/40 | (2006.01) |

(52) U.S. Cl.
CPC ................. *H03H 7/00* (2013.01); *H01F 17/00* (2013.01); *H01G 4/38* (2013.01); *H01G 4/40* (2013.01)

(58) Field of Classification Search
USPC ................................... 361/270, 271; 257/195
See application file for complete search history.

(56) References Cited

U.S. PATENT DOCUMENTS

2004/0084751 A1 *  5/2004  Stern ............................. 257/531

* cited by examiner

*Primary Examiner* — Danny Nguyen
(74) *Attorney, Agent, or Firm* — Wenderoth, Lind & Ponack, L.L.P.

(57) ABSTRACT

A spiral capacitor-inductor device in which an array of unit capacitors 101 is arranged in a loop along the length is provided as the fourth circuit element. An input signal is applied to one end of the array of the unit capacitors, an output signal is taken out from the other end, an electric charge stored in each unit capacitor increases or decreases in accordance with increase or decrease in the bias applied to the device, the increase or decrease in the electric charge causes the current of the loop to increase or decrease, and, as a result, the magnetic flux 103 generated in the device varies. Accordingly, the fourth circuit element is provided that follows after an inductor, a capacitor, and a resistor is provided in which the electric charge stored determines the magnitude of its magnetic flux.

8 Claims, 14 Drawing Sheets a    b

INDUCTOR COMPRISING ARRAYED CAPACITORS

TECHNICAL FIELD

The present invention relates to an inductor comprising arrayed capacitors, and more particularly, to the fourth circuit element which is a device different from the three existing circuit elements, that is, a resistor, a capacitor, and an inductor and which exhibits one-to-one correspondence between the magnetic flux generated in the device and the charge stored in it.

BACKGROUND ART

About 150 years ago, the three circuit elements, a resistor (R), a capacitor (C), and an inductor (L), were invented. An electric charge, a voltage, a current, and a magnetic flux vary in pairs to define a resistor (R), a capacitor (C), and an inductor (L). In these definitions, the electric charge, the voltage, the current, and the magnetic flux occur twice, except for the electric charge and the magnetic flux. In 1971, Leon O. Chua proposed a fourth circuit element by correlating the electric charge with the magnetic flux (Non-Patent Document 1). Since a change in the magnetic flux generates a voltage in the circuit elements of this type proposed so far, such an element has been considered as the fourth circuit element H that the generated voltage is correlated with the stored electric charge instead of directly correlating the magnetic flux with the amount of electric charge. The device with this correlation established is a pristine electrical device which cannot generate a magnetic flux. An example of such a device is a "memristor" (Patent Document 1 and Non-Patent Document 2), which raised an important point for discussion in the recent years. Such a so-called fourth circuit element exhibits a linear relationship between the stored electric charge and the resistance of the device. Eventually, the essential condition for the fourth circuit element is not met in the fourth circuit elements reported so far. Another major issue with this approach is that all of its properties could be generated by using combinations of L, C, and R (Non-Patent Document 1). Therefore, the circuit element H thus defined is not a fundamental element. In other words, the fourth circuit element has not been invented yet that demonstrates a linear relationship between the stored electric charge and the magnetic flux produced in the device. In this regard, Chua's paper in 1971 where he proposed the fourth circuit element for the first time is not correct, either. The reason is that therein, he could create any electronic properties of his proposed fourth element using a combination of L, C and R.

In recent years, it has become apparent that a so-called "memristor" is existing for nearly 40 years. A lot of papers published for almost half a century are now documented in Wikipedia (Non-Patent Document 3). At the same time, Chua has also admitted that his proposal in 1971 was not complete (Non-Patent Document 4). In order to generalize the proposal for the fourth circuit element, Chua has come up with two different devices, namely a mem-capacitor and a mem-inductor. Though Chua has mathematically formulated the mem-capacitor, no mathematical formulation has been proposed for the mem-inductor (Non-Patent Document 5). It should be noted that there cannot be three types of fourth circuit elements and instead of three it should be one. Chua has proposed that the practical realization of mem-capacitor and mem-inductor would be the next challenge. The present inventors have adopted here significantly distinct argument from that proposed by Chua to practically realize the fourth circuit element.

Invention of the fourth circuit element after 150 years of the invention of the first three circuit elements would open up a new world of electronics. Unlike the recently reported invention that claims memristor as the fourth circuit element, a true fourth circuit element H would directly correlate magnetic flux with the charge content in the device. In addition, electronic responses generated by the true fourth circuit element H (hereinafter referred also as device H) should be such that it would not be possible to regenerate those properties using a combination of L, C and R. The architecture of the new device H should be designed in such a way that it would generate a real magnetic flux not its electrical equivalence, which is the essential criterion for the fourth circuit element.

There have been attempts to fuse a capacitor and an inductor for generating new electronic properties (Patent Document 3). However, the concepts use conventional capacitors and the built up architecture is such that it in no way uses charge as a means to control the properties of the associated inductor. Therefore, there has been no attempt to build a hardware wherein fundamental properties of the capacitor that is charge tunes the fundamental properties of an inductor that is current flow. Internal charge storage of a capacitor can never tune the current flowing through the circuit unless it changes the resistance of the capacitor itself and the connecting path between two capacitors in the way simultaneously as a result of the charge storage. Therefore, an atomic scale control over the entire architecture is essential, which is not possible unless an integrated architecture is designed exemplifying the same principle with atomic scale design. Though there exists a device effectively exhibiting one to one correspondence between the stored charge and the electric flux, the above-explained device has not been realized, yet.

PRIOR ART DOCUMENTS

Patent Documents

PATENT DOCUMENT 1: US-A-2009-0184397
PATENT DOCUMENT 2: US-A-2009-0163826
PATENT DOCUMENT 3: US-A-2002-0118077
PATENT DOCUMENT 4: US-A-2008-0316677

Non-Patent Documents

NON-PATENT DOCUMENT 1: Chua, L. O., Memristor-missing circuit element, IEEE Transactions on Circuit Theory CT18, 507-519 (1971).
NON-PATENT DOCUMENT 2: Strukov, D. B., Snider, G. S., Stewart, D. R., and Williams, R. S., The missing memristor found, Nature 453, 80-83 (2008).
NON-PATENT DOCUMENT 3: http://en.wikipedia.org/wiki/Memristor
NON-PATENT DOCUMENT 4: Memristor and memristive state symposium, 21 Nov. 2008 http://www.youtube.com/watch?v=QFdDPzcZwbs
NON-PATENT DOCUMENT 5: Circuit elements with memory: memristors, memcapacitors and meminductors http://arxiv.org/PS_cache/arxiv/pdf/0901/0901.3682v1.pdf

SUMMARY OF THE INVENTION

Problems That the Invention is to Solve

It is an object of the invention to design a practical device that can demonstrate one-to-one correspondence between the stored electric charge in the device and the magnetic flux generated therein.

Means for Solving the Problems

The inventors of this invention conceived an electronic or photonic device that provides unprecedented electronic properties. First, its response is much faster than any other existing fundamental circuit elements, second, it demonstrates a linear current output or functions as a resistor to the DC signal, third, it turns an input AC signal out of phase, fourth, it stores electrical charge and operates as a electromagnetic power supply.

First, the present invention provides a spiral capacitor-inductor device composed of arrayed unit capacitors assembled in the form of loops along the length, wherein input signal is applied from one electrode end and output is taken from the other end, and wherein electric charge stored in the capacitors increases or decreases consistently with an increment or decrement of applied bias across the device, which respectively increases or decreases the loop current, thus changes the magnetic flux generated in the device.

In this specification, we call this electronic or photonic device as "a spiral capacitor-inductor device" or simply "capacitor-made-inductor", as capacitors charge and discharge to make current flowing path resistance less or highly resistive so that more or less current flows through the loop path tuning the magnetic flux produced in the device.

According to one aspect of the present invention, there is realized a spiral capacitor-inductor device comprising arrayed unit capacitors assembled in the form of loops along the length, wherein input signal is applied from one electrode end of said arrayed unit capacitors and output is taken from the other electrode end of said arrayed unit capacitors, wherein charge stored in said unit capacitors increases or decreases consistently with an increment or decrement of applied bias across the device, and wherein said charge respectively increases or decreases current through said loop, thus the spiral capacitor-inductor device is implemented in which the magnetic flux generated therein is changed.

Said unit capacitors may be built using any one or combination of the materials selected from the group consisting of protein, organic dye, inorganic composites, nano-particles, dendrimers, organo-metallic complex, polymer, and bio-molecules which can reversibly store and release charge or energy in their structure if a predetermined condition is imposed externally.

Said unit capacitors may be arranged in a structure that enables current flowing through a singular or plural closed loops in said structure along the length of the device, said structure following any one of the two possible configurations A and B:

A. assembly of said unit capacitors wherein said unit capacitors physically move to change their relative locations orderly or disorderly along the length of the device and effectively trigger current to flow in a loop generating said magnetic flux; and B. assembly of unit capacitors which form a defined spiral, disk shaped, conical or random geometry structure formed by weak interaction, covalent bonding, non-covalent bonding, metallic bonding or non-metallic bonding in such a way that said assembly enables flow of current from one unit capacitor to another neighboring one, eventually leading to a current flow in a singular or plural loops along the length of the device.

Charging or discharging of said unit capacitors may change the conductivity of singular or plural closed loops which in turn increases or decreases said current flow through said loop thus changing said magnetic flux produced in the device.

Charging or discharging of said material in said unit capacitors may occur orderly or disorderly in one or multiple loops of the entire device which loops are selected in the process orderly or randomly, wherein said magnetic flux may change only when finite number of electronically charged loops change or said current flowing through the device changes.

The current contribution due to charging and discharging of materials in said unit capacitor and contribution of current flowing through said loop may together modulate the phase of an input signal in particular condition to cause the output AC signal of the device to be 180° out of phase in the positive or in the negative direction of the input signal applied between said one end and said other end.

Examples of said unit capacitors include microtubule containing $\alpha\beta$-heterodimer of tubulin, and electrodes may be formed at respective ends of said microtubule as input and output of said spiral capacitor-inductor device.

Said spiral capacitor-inductor may be such that, in spite of presence of capacitative and inductive features, the DC current output of said spiral capacitor-inductor device is linear in a certain range of externally applied electric bias across the entire device, in this region the device operates as a resistor, the current voltage characteristics appears as a hysteresis loop and at a lower temperature, and the device shorts if a certain ac signal is applied in addition to the DC bias.

The spiral capacitor-inductor may be such that the electronic and magnetic energy together increases (i.e., is stored) or decreases (i.e., is discharged) as electromagnetic energy at a certain rate and thus the storage and supply capability can be adjusted by changing the length of said loop and the number of the unit capacitors per unit length.

Said spiral capacitor-inductor may be such that due to the presence of an inductive feature of loop current the entire device turns to a ballistic conductor in a certain range of frequency of an AC signal that is applied externally, and as a result, a dissipation-less transport of input signal takes place along the length of the device in this frequency range.

Said spiral capacitor-inductor may be such that beyond a certain threshold bias that is applied externally between said two electrodes, said device switches to a high conducting state, and if the external bias is increased continuously beyond said threshold voltage, the conductivity of said device does not change.

Said spiral capacitor-inductor may be such that the rate of growth and decay of output current in response to an input pulse, is faster than any equivalent device composed of the other three fundamental circuit elements, namely resistor, capacitor and inductor.

Effect of the Invention

Advantageous effects of the invention are listed below.

1. The present invention practically realizes the fourth circuit element missing in the man made electronics for all these years after its conceptual inception in 1971.

2. The present invention enables us to send dissipationless signal in a particular frequency range. It is a unique device that demonstrates ballistic transport at room temperature, and at atmospheric pressure.

3. The device of the present invention is a typical device that has inherent capacitative and inductive features together in its architectural design, in spite of that, the device provides a linear current output like a resistor.

4. The device of the present invention is a typical battery that can store and deliver electromagnetic power to the external load.

5. The device of the present invention is a device that turns input signal 180 degree out of phase. This is important since in a circuit-network where noise is more than 66% of the input signal conventional devices are not reliable; however, similar sequentially coupled devices can sustain the prime signal in presence of noise and process it.

6. The device of the present invention is a device whose time response is faster than any other fundamental phase modulating electronic devices namely resistor (note that since any real resistor element inevitably contains capacitive and inductive components, it also causes change in phase), capacitor and inductor and their derivatives (refer to the graph demonstrating the decay in the current in the body (i.e., not the inset) of FIG. 9).

7. The device of the present invention is a device that can process multi-level logic beyond binary processing system.

MODE FOR CARRYING OUT THE INVENTION

The present invention will be described in more details below.

As mentioned above, the present invention is a spiral capacitor-inductor device having arrayed unit capacitors assembled in the form of loops along the length (FIG. 1), wherein input signal is applied from one electrode end and output is taken from the other end, charge stored in the capacitors increases or decreases consistently with an increment or decrement of applied bias across the device, which respectively increases or decreases the loop current, thus changing the magnetic flux generated in the device.

Figure 2:
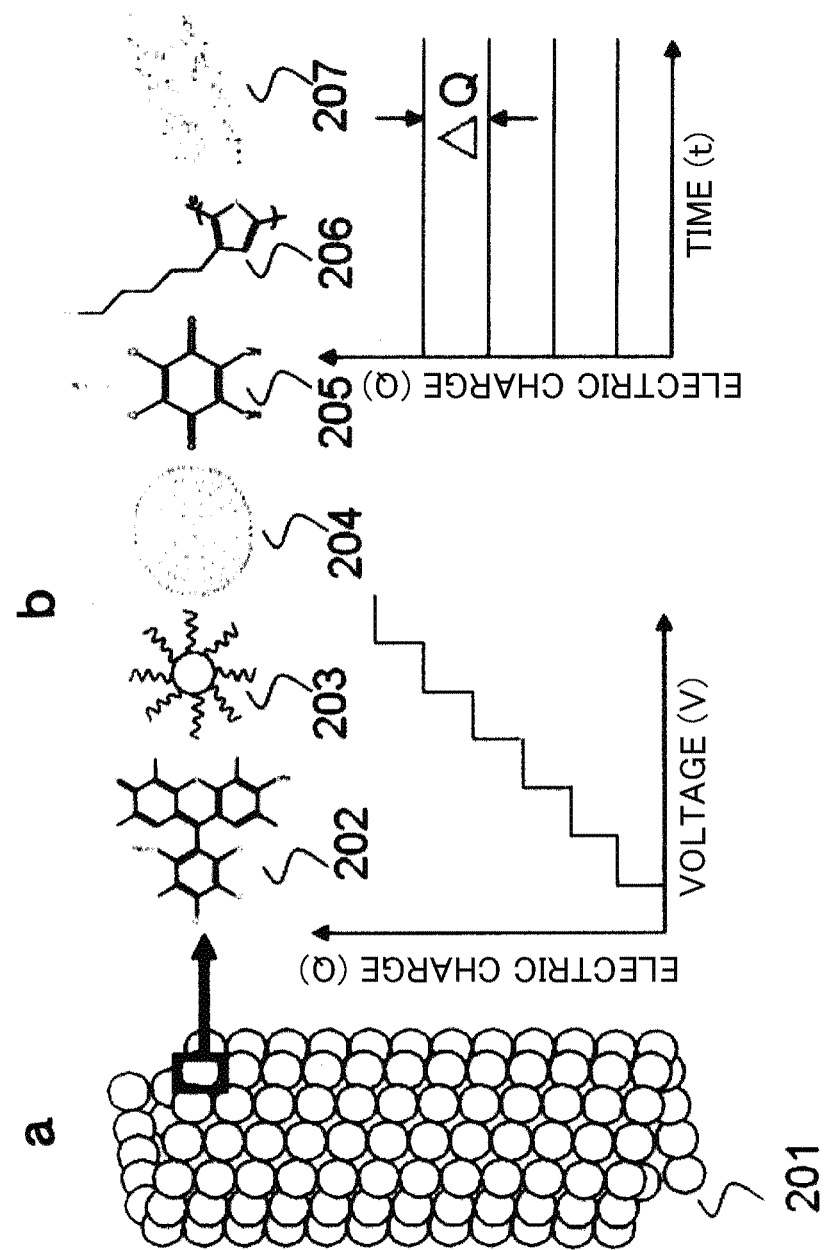
FIG. 2 shows a schematic drawing of particular kinds of the unit capacitor's architecture and a drawing indicating an equivalent circuit design. (a) shows an example of the memory function further added to the unit capacitor, (b) shows examples of molecular material that can constitute the unit capacitor, and (c) shows an example of the staircase like feature of the quantity of stored charge with respect to the applied voltage across the unit capacitor device, leading to the formation of a multilevel switch in the unit capacitor.

The unit capacitors used to construct this electronic device could range from any kind of organic and inorganic material that could store electrons when an external energy is applied to the system (FIG. 2). The molecular systems are preferred for the reason that atomic scale understanding of the mechanism could be established and electronic or photonic properties could be tuned from the atomic level. A unit of capacitor is a single protein molecule, an organic dye molecule, an inorganic composite, a single nano-particle, a single unit of dendrimer, a organo-metallic complex, a polymer bead like PSS (sodium polystyrene sulfonate), a single bio-molecule like an enzyme molecule or a single unit of vitamin C or DNA, which can store and release charge or energy in its structure if certain condition (application of a threshold pulse) is imposed externally. Reversible electron exchange capability and tuning conductance of the system with electron exchange or conformational change (to be explained in detail hereinafter with reference to FIG. 2) are essential requirements. There is no limiting condition for the number of electrons, control in the system increases with the number of electrons associated with the conductance change.

Inside the spiral capacitor-inductor, unit capacitors with particular properties described above should arrange themselves by self-assembly or they should be directed by automation or circuited manually into a structure that enables current flowing through a singular or plural closed loops along the length of the device. The structure might follow any one of the two possible configurations A and B.

A. An assembly of unit capacitors, which does not have a defined structure (semi-solid or liquid state) as the unit capacitors physically move to change their relative locations orderly or disorderly along the length of the device and effectively triggers the current to flow in a loop generating a magnetic flux.

B. An assembly of unit capacitors, which forms a defined structure by weak interaction, covalent bonding, non-covalent bonding, metallic bonding or non-metallic bonding in such a way that enables flow of current from one unit capacitor to another neighboring one, eventually leading to a current flow in a singular or plural loops along the length of the device.

Figure 3:
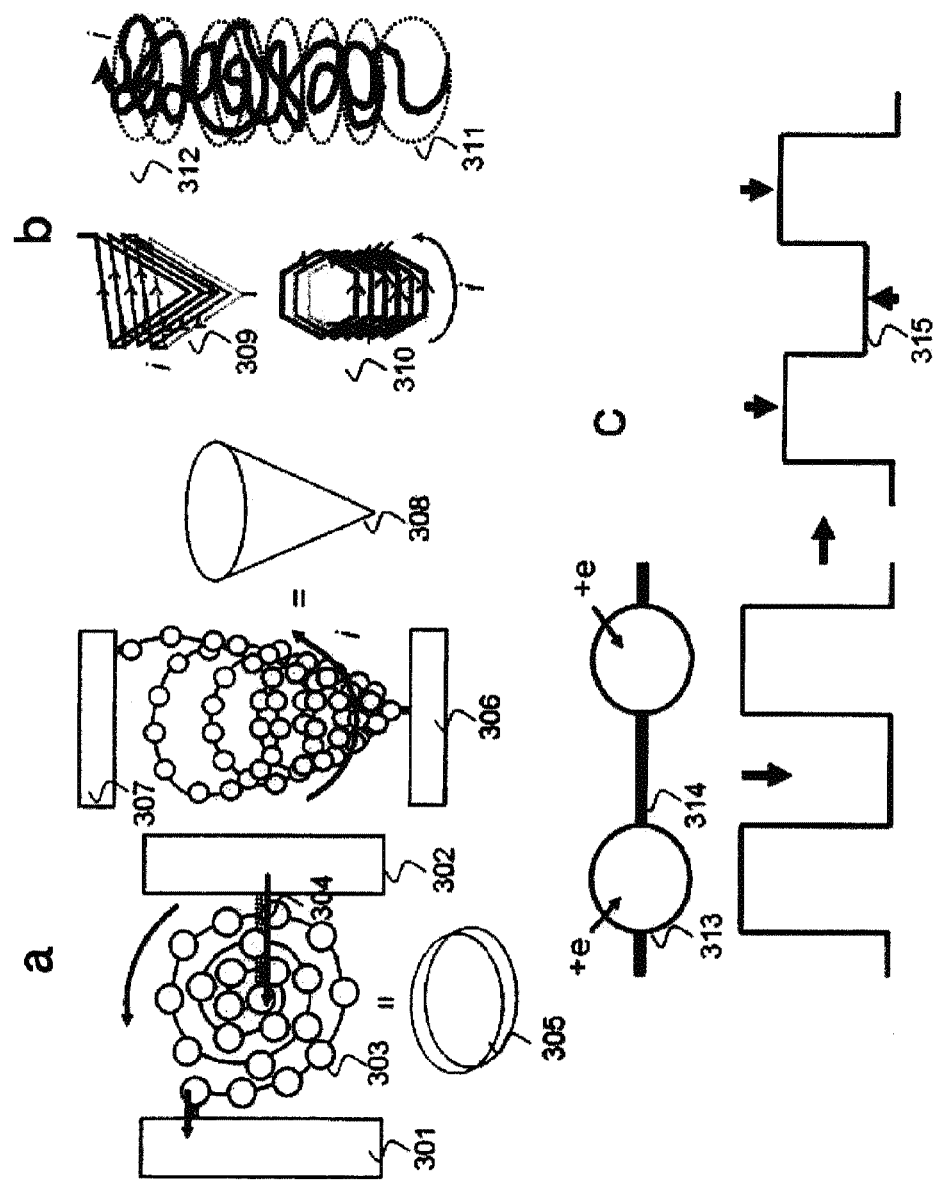
FIG. 3 describes the loops in the device. (a) shows examples of the closed loop features in the shape of a random path to construct a particular loop or the geometrically symmetric loop that unit capacitors form. (b) shows examples of the dynamic motion of unit capacitors acquiring a positive and a negative drift in the effective loop current. (c) describes that charging of unit capacitors changes the coupling between the neighboring unit capacitors of a loop, which in turn changes the conductivity per unit length.

The ordered structure could form not only in the shape of a spiral assembly, but also in the form of divergent circular loops leading to a disk-shaped assembly, in the form of a conical or random assembly that could lead to the creation of non-homogeneous magnetic flux (FIG. 3).

One of the most important features of the spiral capacitor-inductor is that the charging or discharging of the unit capacitor due to the modulation of applied electric bias should change the conductivity of singular or plural closed loops, which would in turn increase or decrease the current flow through the loop thus changing the magnetic flux produced in the device.

Therefore, coupling of individual unit capacitors is extremely important to construct an effective pathway of electron transport. That is, it is important to design the molecules so that the unit capacitors may appropriately be connected. Conductivity of the path should be tunable simply by charging or discharging the capacitors. If the unit capacitors exchange charge then the conductivity of individual capacitors increases or decreases, however, if this change cannot overcome the resistance of the separation length between two unit capacitors, then the loop conductivity will not change and the magnetic flux will become independent of the charge content in the device. Depending on the electronic character of the unit capacitor used, suitable conduction paths are to be designed.

The separation between the two neighboring loops should be designed to avoid any leakage of current from one loop to another destructing the magnetic flux generation in the device.

Figure 5:
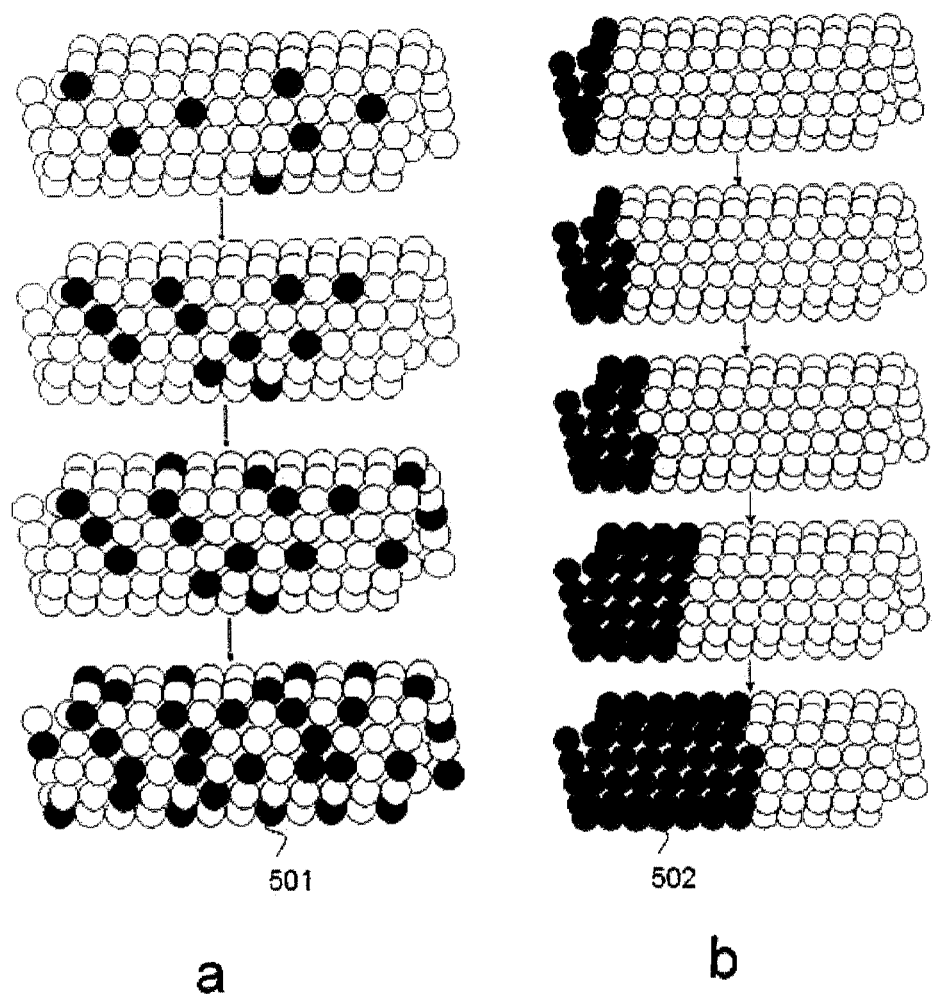
FIG. 5 shows the effect of charging of the unit capacitors in distinctly different architectures and depicts two cases, one case being charging of unit capacitors at random locations along the length of the device, the other case being randomly charging of unit capacitors at different locations, showing the difference between the two distinct natures of tuning the magnetic flux generated in the device.

When external bias is changed towards a positive or negative direction, the unit capacitors residing inside the spiral capacitor-inductor stores or releases the charge. During this process, the selection of unit capacitors which would release or store electron first and which one next to it, is an important parameter. The selection of such unit capacitor for the electronic response could occur orderly along the conduction path one after another or disorderly by random selection of unit capacitors from one or multiple loops of the entire device (FIG. 5). The loops could also be selected in the process orderly or randomly from the entire length of the device. The magnetic flux changes only when the number of electronically charged loops changes or the current flowing through the device changes, number of effective loops that is flowing large current changes and density of the loops or the ratio of total number of loops to the length of the device changes effectively.

Figure 6:
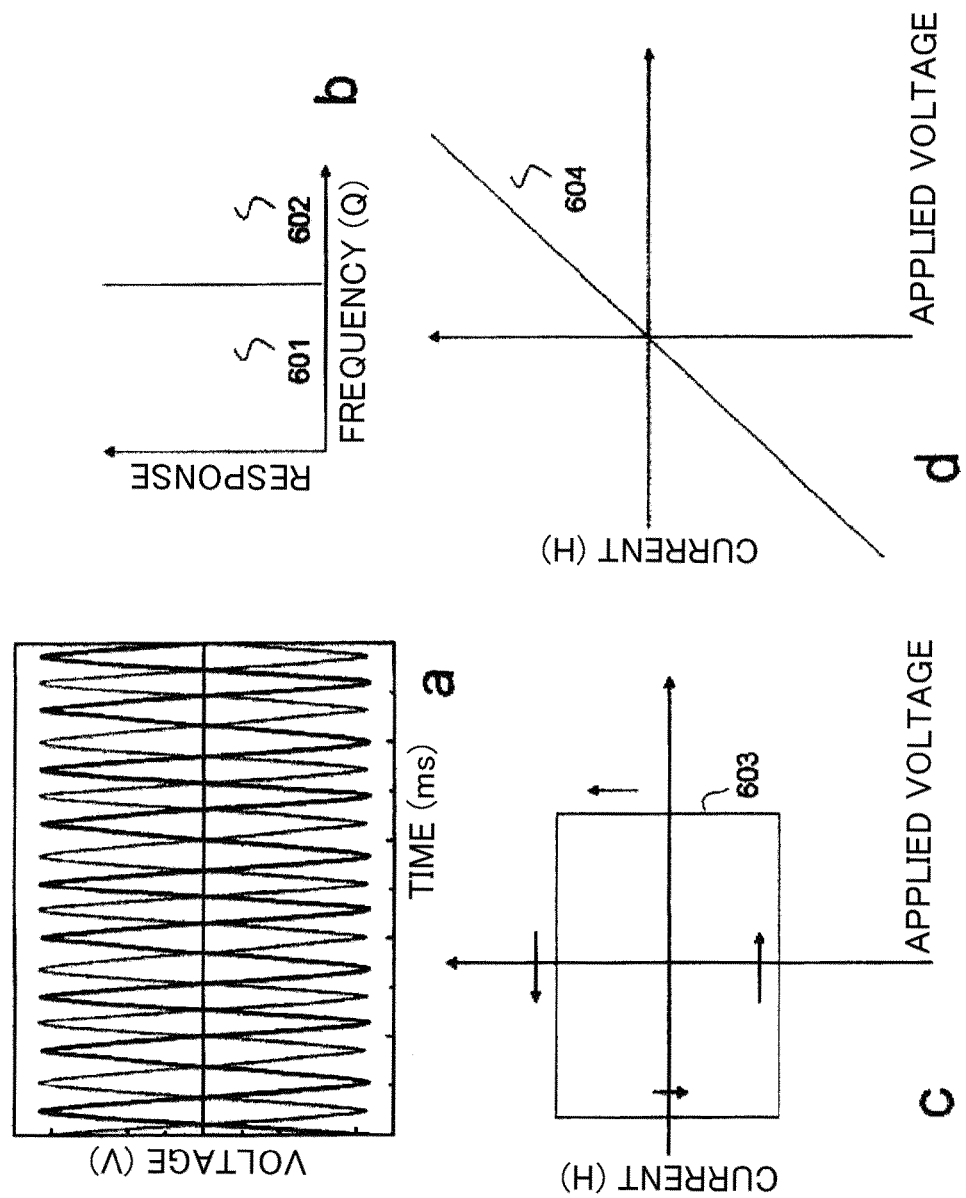
FIG. 6a is a drawing demonstrating input and out-of-phase output AC signal generated in the device at a particular frequency.
FIG. 6b is a schematic drawing of the frequency band and the region where the device exhibits the out-of-phase transition of an input signal.
FIG. 6c demonstrates that the voltage-current characteristics of the device involve hysteresis.
FIG. 6d is a drawing showing the possible linear current-voltage characteristics at a certain part of the voltage range.

The loop shaped design of arranging the unit capacitors inside a spiral capacitor-inductor device, enables two current components inside the device notably the current contribution due to charging and discharging of the materials in the unit capacitor and the contribution of current flowing through the loop, to interact following the vector addition rule while delivering the output. As a result, they contribute together in modulating the phase of an input signal. The vector addition suggests that the output of an AC signal will be 180° out of phase in the positive or in the negative direction of the input signal applied between the two electrodes since capacitative current retards the phase of an alternating signal by 90° and an inductor changes the phase of an alternating signal by 90° towards the positive direction (FIG. 6).

Figure 4:
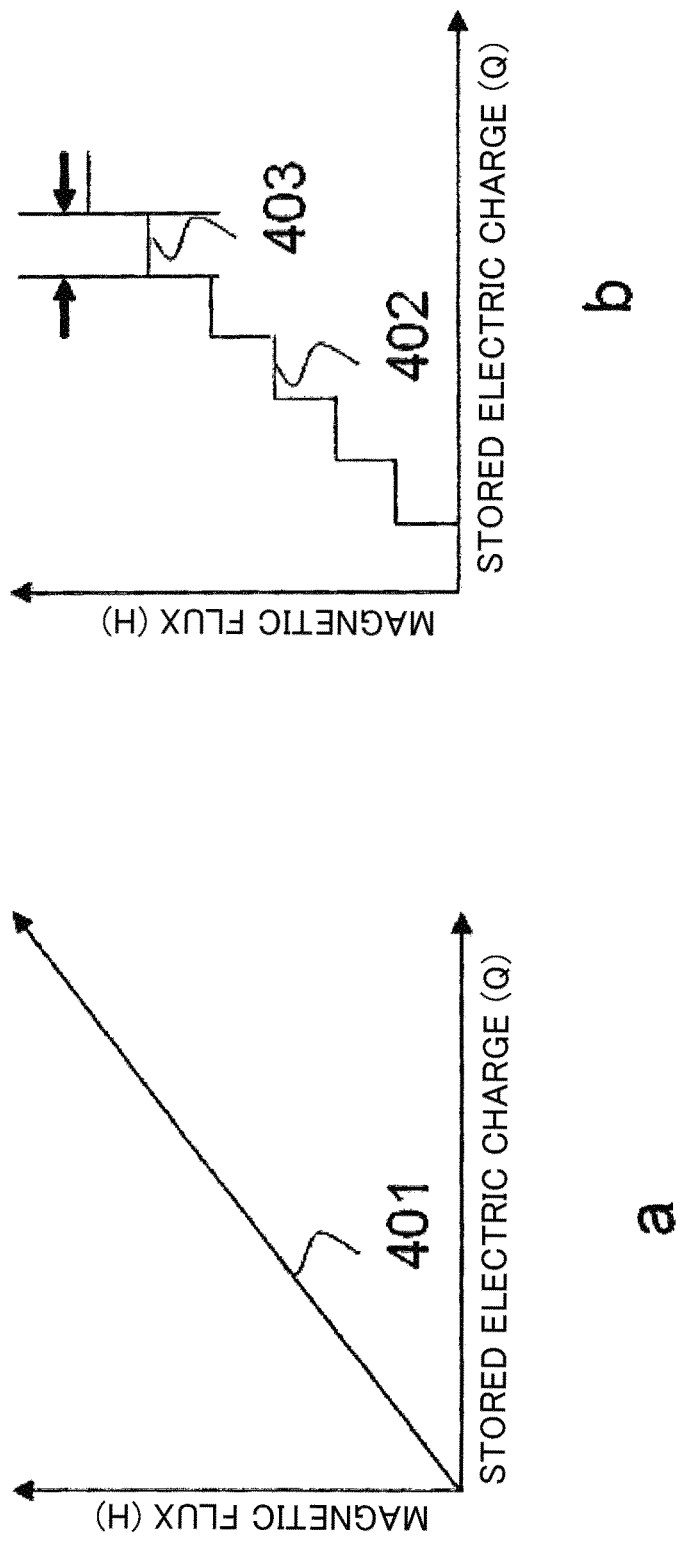
FIG. 4 is a schematic drawing of one-to-one correspondence among the stored charge, conductivity per unit length of the device and finally the magnetic flux produced. (a) shows the ideal relationship between the stored charge and the magnetic flux produced in the device. (b) shows an example of tunable relationship between the stored charge and the magnetic flux produced in the device.

The spiral capacitor-inductor, wherein, in spite of presence of capacitative and inductive features, the DC current output is linear (FIG. 4) in a certain range of externally applied electric bias across the device, in this region the device operates as a resistor. The resistive feature in presence of a DC signal provides an unique functionality to withstand both DC voltage source and DC current source for its AC operation which is not possible for inductor and capacitor. The device is basically electrically short in presence of any AC signal during applied electrical bias scan. In the lower temperature the device depicts nearly perfect square hysteresis loop (FIG. 6) which converges as the temperature increases.

Figure 7:
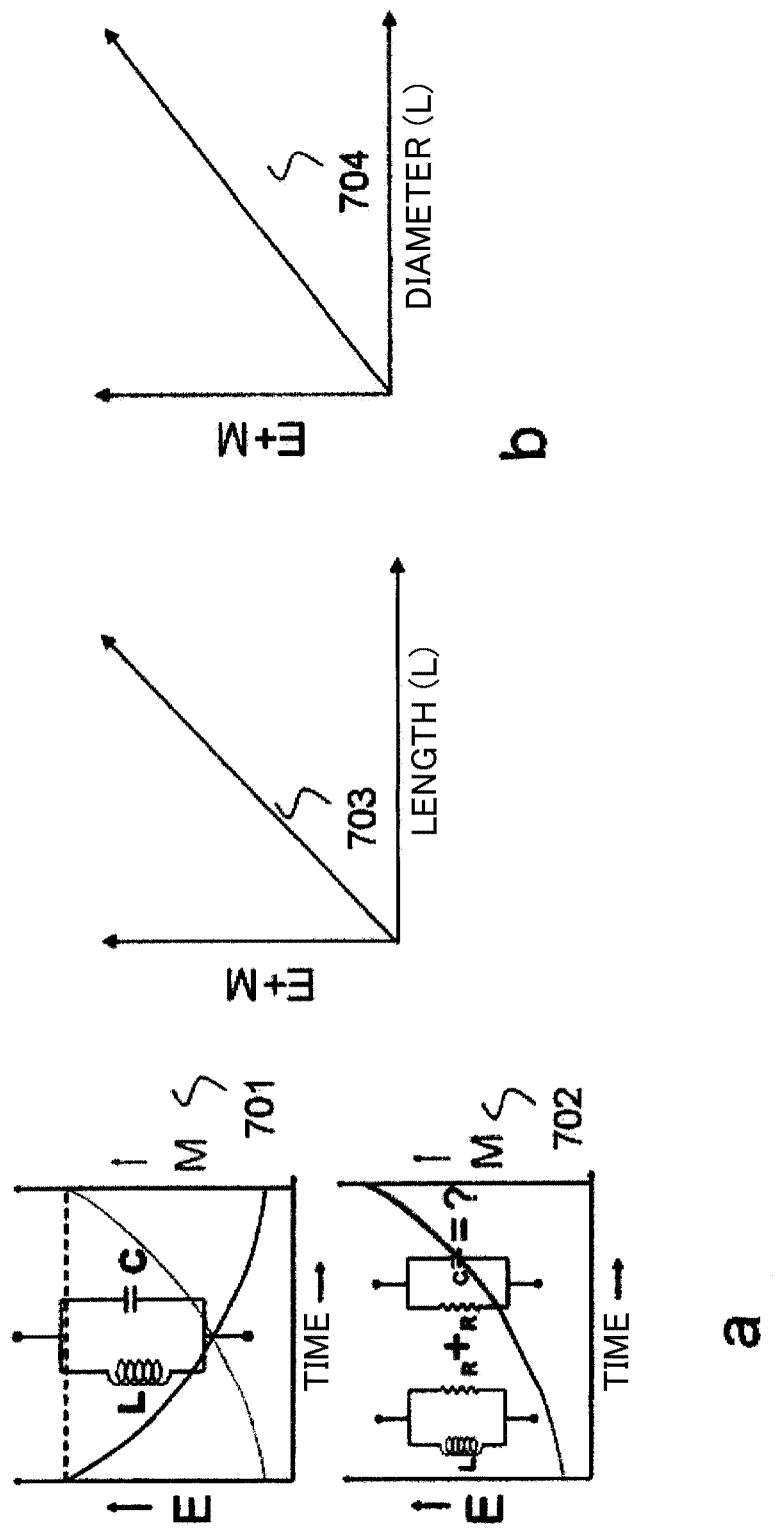
FIG. 7a is a drawing showing a growth and decay of electronic and magnetic components of the energy, together with time or applied external bias.
FIG. 7b is a drawing showing an example of variation of length of the device, loop diameter, capacitors per unit length with the energy stored in the device.

In the spiral capacitor-inductor, the electronic energy stored in the unit capacitors and the magnetic energy stored in the electric field of loop current increase (charge stored) or decrease (charge released) together in the electromagnetic form of energy following a particular rate (FIG. 7). Therefore, by changing the length of the loop perimeter and the number of unit capacitors per unit length in a loop, the energy storage and the energy supply capacity could be tuned.

Figure 8:
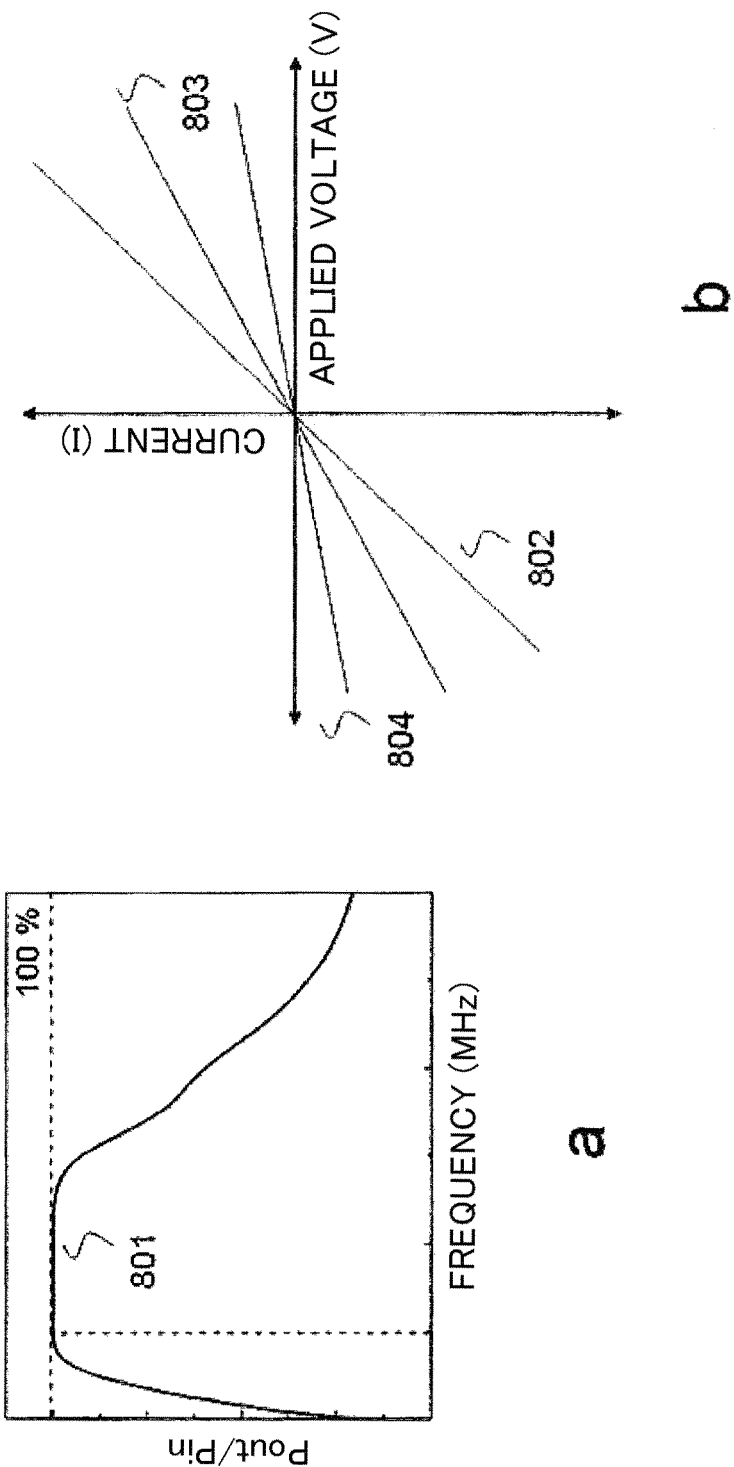
FIG. 8a is a drawing showing dissipationless transport of energy from one point to another (ballistic regime).
FIG. 8b is a drawing showing the multi-level switching effect. This depicts various current-voltage characteristics in different bias ranges, showing that, after application of a particular external bias, these characteristics do not change and all the current-voltage characteristics overlap on each other.

In the spiral capacitor-inductor of the present invention, where in a certain range of frequency of an AC signal that is applied externally, the entire device turns to a ballistic conductor (FIG. 8). Such a phenomenon evolves due to the presence of an inductive feature of loop current which is known to generate a resonant behavior. As a result of inductive resonance, dissipation-less transport of input signal takes place along the length of the device in this frequency range.

During current voltage measurement across the spiral capacitor-inductor, it has been observed that beyond a certain threshold bias that is applied externally between the two electrodes, the device switches to a high conducting state. If the external bias is increased continuously beyond the threshold voltage, the conductivity of the device does not change.

Figure 9:
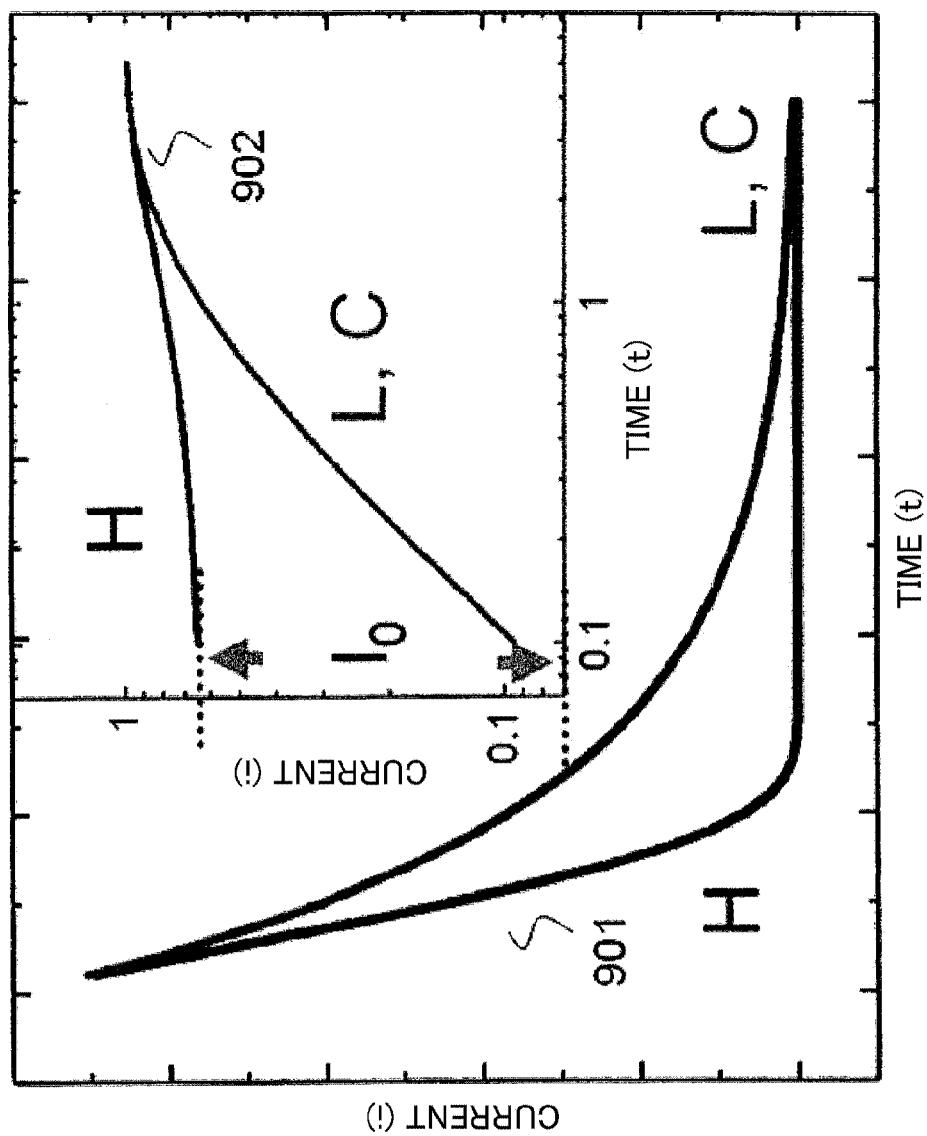
FIG. 9 is a drawing showing the rate of growth and decay of current in the device and a comparison of this rate with the same that of the existing other three fundamental electronic elements.

In the spiral capacitor-inductor, the rate of growth and decay of output current when an input pulse is applied across the device is faster than any equivalent device composed of the other three fundamental circuit elements, namely resistor, capacitor and inductor that cause phase change (FIG. 9).

Figure 1:
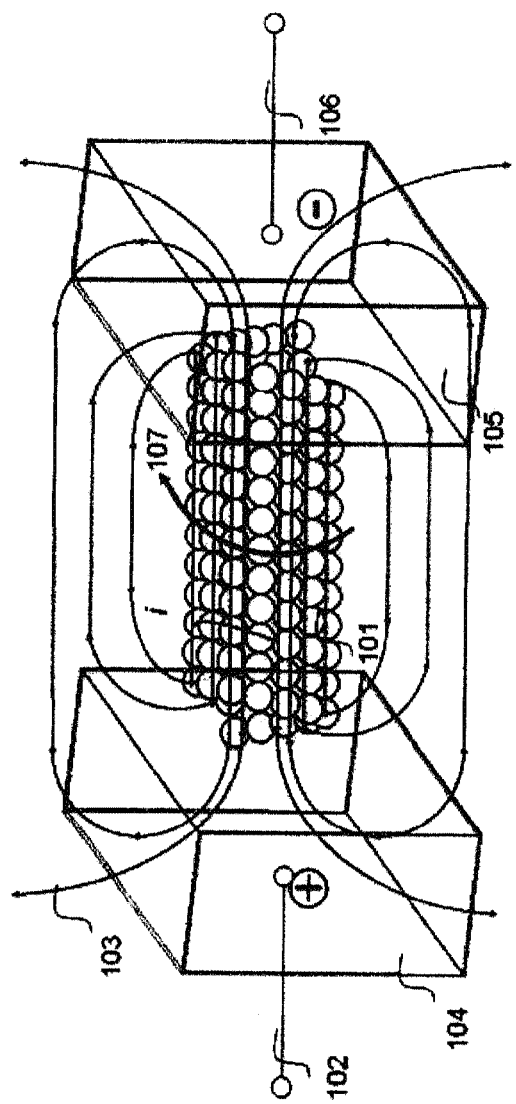
FIG. 1 is a schematic drawing for the spiral capacitor-inductor of the present invention. This is a two terminal device and charging of the unit capacitors arranged in loops changes the conductivity of the arrayed paths.

FIG. 1 is a schematic drawing for the capacitor tuned inductor of the present invention. The device is a supramolecular assembly of the unit capacitors denoted as circular balls 101, and the entire assembly is sandwiched between two electrodes 104 and 105 connected to the external circuit with outlet 102 and 106 respectively; the device generates magnetic flux, with the lines of forces of this magnetic flux denoted as lines like 103. In FIG. 1, the supramolecular assembly is a spiral assembly of linearly connected capacitor units 101.

FIG. 2 is a drawing showing a possible design of the unit capacitors. Note that, the respective unit circular balls of the supramolecular assembly 201 could be a single molecule or an assembly of molecules. However, these unit capacitors do not need to follow every single property of the conventional capacitors. Conventional capacitors change the phase of an input AC signal by 90 degrees and the temporal growth or decay of current would follow a well defined exponential relation. Here, the molecular material that can function as a unit capacitor stores a finite amount of charge and does not release unless a particular condition is imposed naturally or artificially. The examples of such a system could be protein, single molecule multilevel switch 202, 205; reversibly redox-active nano particle 203, dendrimer 204, polymer 206, DNA 207 etc. Only similarity that a unit capacitor has with the conventional capacitor is both store charge. However, the charge storing mechanism is entirely different. Instead of polarization in the dielectric surface, excess electrons physically change the confirmation of the molecule and generate suitable space for the storage in a local region of the molecule. The control of charge storage in the unit capacitor is originated from the staircase feature of the charge storage with the increment of applied bias as shown in FIG. 2. The unit capacitor retains the stored charge for a particular period of time. Unlike the conventional capacitor, with the exchange of charge, the resistance of the unit capacitor decreases; it transports the electrons or carriers through it easily. The unit capacitor also generates leakage current like conventional unit capacitors which is a beneficial for this particular kind of device.

Apart from the spiral assembly, the capacitor-tuned inductor device of the present invention, the design of which is presented in the FIG. 3(a), enables to create the device of the present invention in a 2D form which could easily be embedded in an integrated circuit chip. Between two electrodes 301 and 302 a planar spiral assembly 303(305) of the unit capacitors is placed. The center of the assembly is one end of the spiral assembly where one electrode 304 is connected and the other electrode is connected at the outer end. The electrode 304 is embedded inside the substrate and e-beam lithography is one useful tool to build such embedded electrode.

Both hardware architectures of the present invention demonstrated in FIGS. 1 and 3(a) generate a homogeneous magnetic flux. The linear assembly of the unit capacitors arranged on an imaginary conical surface 308 and sandwiched between electrodes 306, 307 generates inhomogeneous magnetic flux.

As shown in FIG. 3(b), the loops of spiral assembly could also be tuned ranging from triangular 309, hexagonal 310, or completely random where an imaginary dotted boundary 311 or 312 is required to be drawn to identify a particular loop. All these paths follow one particular condition that unit capacitors like 313 while exchanging electrons, decrease the resistance of the path 314 between two unit capacitors. The equivalent potential well representation of FIG. 3(c) will not only have a change in the barrier height but also a change in the gap width is observed. If an electron travels through the loop path it will face a series of potential wells of different height, width.

All the possible capacitative inductor demonstrated above will exhibit a linear relationship 401 (FIG. 4(a)), between the charge content in the device and the magnetic flux generated in the device. As unit capacitors are assembled in a linearized manner and magnetic flux generated in a device depends on the number of loops, unless a loop is completed magnetic flux does not change. This gap 402 or 403 provides the threshold length for tuning the magnetic flux generated in the device (FIG. 4(b)). One point needs to be noted is that the path considered here for electrode transport is the high conducting path, or the path created by electron charging of the unit capacitors. This charging can occur in two possible ways: either randomly across the assembly 501 (FIG. 5(a)), or sequentially one after another 502 (FIG. 5(b)).

As shown in FIG. 6(a), an AC signal sent to the device of the present invention in the range 602 above a threshold frequency 601 of particular frequency band is turned 180 degrees out of phase in its output. In FIG. 6(a), either one of the two curves differentiated by the thickness in gray scale is the input, the other the output. The current-voltage characteristics of this device of the present invention are a hysteresis loop 603 in the graph of FIG. 6(c). The feature of hysteresis loop varies with the electronic nature of the unit capacitor and the bonding between two linearly connected unit capacitors. The hysteresis feature is observed only at the low temperature regime beyond a certain temperature wherefrom the device starts conducting. Gradually, beyond a certain temperature range, the hysteresis loop converges into a single plot and semiconductor-like current voltage characteristics are observed (FIG. 6(b)). In presence of pure DC signal the conductivity of the device is in the insulator regime. However, in present of an additional AC signal the same device gets short and conducts as metal 604, as shown by 604 in the graph of FIG. 6(c). The device returns to the insulating regime as soon as the additional AC signal is removed.

The capacitative and inductive features of the device are in contrast to the conventional LC circuit 701 shown in the upper portion of FIG. 7(a). In the conventional LC circuit, the energy of one component increases at the expense of the other. However, in the device of the present invention, both inductive and capacitative energy increases or decreases together for the device of a particular length, as shown by the features 702 in the lower portion of FIG. 7(a). If the length of the unit capacitor assembly increases with the rest of the parameters kept fixed, then total energy storage capacity of the device increases as shown in the left-hand side graph of FIG. 7(b). If the diameter of the unit capacitor assembly increases with the density of capacitors per unit length and total length of the assembly is kept fixed, then also the energy storage capacity increases, as shown in the right-hand side graph of FIG. 7(b).

There is a near zero resistance of the device in a particular frequency region, wherein entire energy packet is transported from one side of the assembly to another without losing any energy, as shown in the graph in FIG. 8(a). It is also possible to generate different conductivity of the device by changing the length of the assembly, as shown by 802, 803 and 804 in the graph in FIG. 8(b). We denote the device of current invention as H below. Its current response for an electrical bias input grows 902 and decays 901 faster than the L and C, as shown in FIG. 9. Though R, C, and L cannot generate the fourth element H of the present invention, we construct a simplified current expression for H for the relative comparison. Tubulin dimers are charged following $Q=Q_0(1-\exp(-t/CR))$ and as $Q \propto L$, we get $L=L_0(1-\exp(-t/CR))$. The current grows in the inductor following $i=i_H(1-\exp(-tR/L))$, therefore the current in an H grows following equation $i=i_H(1-\exp(-tR/L_0(1-\exp(-t/CR))))$ and decreases following $i=i_H(\exp(-tR/L_0(\exp(-t/CR))))$. Considering C dominating current, we get current growth as $i=i_H(1-\exp(-t/RC_0(1-\exp(-Rt/L))))$. These expressions have been used here to plot the current for the device of present invention.

Here, the inventors of the present invention define an essential fourth element H that includes all aspects of symmetry argument as tabulated in TABLE 1 and as an experimental evidence they have demonstrated the electronic measurements of a single microtubule by taking out tubulins from the porcine brain and reconstituting the architecture outside. The characterization shows that microtubules (MT) follow these criteria as mentioned above, as explained in the embodiment. Therefore, several other spiral molecular assemblies including spiral supramolecule such as actine have also demonstrated similar properties.

TABLE 1

| | Resistor | Capacitor | Inductor | H |
|---|---|---|---|---|
| Origin | $dV = R\,dI$ Change in current changes voltage drop | $dQ = C\,dV$ Change in bias changes the charge stored in it | $d\psi = L\,dI$ Change in current changes the magnetic flux generated | $d\psi = H\,dQ$ Storage of charge changes the magnetic flux. |
| Energy | $\sim I^2 R$ | $\sim V^2 C$ | $\sim I^2 L$ | $\sim I^2 H$ |
| Device Architecture | Scattering centers | Traps | Loops | Loop of traps |
| Current Voltage spectrum | Linear | Exponential | Exponential | Linear and exponential |
| Opposes with time | None | Voltage | Current | Both current and voltage |
| Phase change, current | 0 | 90 | −90 | ±180 |
| Correlation | $C = 0, L = 0, H = 0$ | $R = \infty, L = 0, H = 0$ | $R = 0, C = 0, H = 0$ | $R$ = finite $C$ = finite, $L$ = finite |
| Operating field | dc | ac | ac | dc and ac |
| Operating source | Voltage or current | Voltage | Current | Voltage or current |

In the above description, the cases were explained where a DC signal, an AC signal (sinusoidal wave), and a pulse signal were used as the input signal. For example, a DC signal may be used for energy storage purposes, an AC signal may be used for electric power transmission purposes, and a pulse signal may be used for nonvolatile digital memory application.

EXAMPLES

Microtubules were extracted from porcine's brain by Cytoskeleton (Denver, Colo., USA). Purified MT subunits (tubulins) were preserved at −80° C. To polymerize tubulin into 6.5 μm long microtubules, 160 μl of Microtubule cushion buffer (60% v/v glycerol, 80 mM PIPES (piperazine-1,4-bis (ethanesulfonic acid)) pH 6.8, 1 mM EGTA, 1 mM $MgCl_2$) was added to 830 μl of general tubulin buffer (80 mM PIPES pH 7, 1 mM EGTA (ethylene glycal tetraacetic acid), 2 mM $MgCl_2$) and 10 μl of 100 mM GTP (guanosine triphosphate) solution. This mixture was kept in an ice bath for 10 minutes. From this mixture, 200 μl solution was added to 1 mg of tubulin and again it was incubated in an ice bath for 10 minutes. Afterwards this stock was placed in an incubator at 35-37° C. for 40 minutes. Then, to stabilize microtubules 20 μl of paclitaxal dissolved in anhydrous DMSO was added to the solution and it was incubated for a further 10 minutes at 37° C. MT length was tuned to be ~4-20 μm.

To prepare film, the solution was diluted 8 times using microtubules cushion buffer and paclitaxol DMSO solution and dropped on a 45° tilted Si (100) substrate and interdigited electrodes kept at −20° C. overnight. Electric field was applied across the substrate for parallel alignment of the MTs. Excess MT solution was removed from the substrate using a filter paper (Whatman). The substrate was then dipped into General Tubulin Buffer and once again dried blowing $N_2$ in the similar fashion. The process was repeated twice. The substrate was placed in a refrigerator for 3 hours to dry out the surface partially.

Reconstitution of α and β tubulin into αβ heterodimer of dimensions 46×80×65 Å$^3$ was confirmed via atomic force microscopy with ultra-fine tip. Potential mapping of MT confirmed lattice A configuration.

At the two ends of a single microtubule chain, two gold electrode pads were fabricated to construct a device by e-beam lithography. The two end electrodes were connected with the external electronic characterization circuitry.

Unlike memristor, a microtubule MT validates the symmetry arguments on every single property of the existing three elements as indicated in Table 1. Device H of the present invention is a helical nanotube/nanowire that stores/releases charge like Capacitor C and the spiral current generates magnetic flux like Inductor L. Even though Inductor L and Capacitor C grows/decays together inside, an ideal device H is remarkably linear in DC output. For purely geometric reasons, an accurate magnetic flux regulator and co-existence of Inductor L and Capacitor C turns an input AC signal out of phase. Device H may initiate a ballistic transport, as complete architecture may become a coherent system under particular electric field. MTs tune electromagnetic energy storage/transport by changing its length and provides essential out-of-phase signal conversion capabilities to bio-systems.

In contrast, Chua used only one symmetry argument, $\Phi \propto Q$, for defining the fourth element memristor. Due to the periodicity of helix and quantized charging, MT can tune its electromagnetic energy/power accurately by changing its length. The threshold bias for switching to the ballistic regime increases with its length. At the same time, magnetic flux increases in a staircase fashion. Therefore, by changing its length, MT can modulate its energy storage, and the critical signal required for its coherent transport. Eventually it also alters the maximum logic states it can process. Therefore, the fourth element MT inside a living cell can take active part in a massively complex multilevel signal processing through cytoskeleton. Previous to the present inventors' work, MTs were used merely as capacitors (Patent Document 4).

Embodiments of the present invention based on MT will be explained with reference to AFM images of the device of the present invention actually constructed, its measurement data, and the schematic drawings.

[Fundamental Feature of Fourth Circuit Element H]

Figure 10:
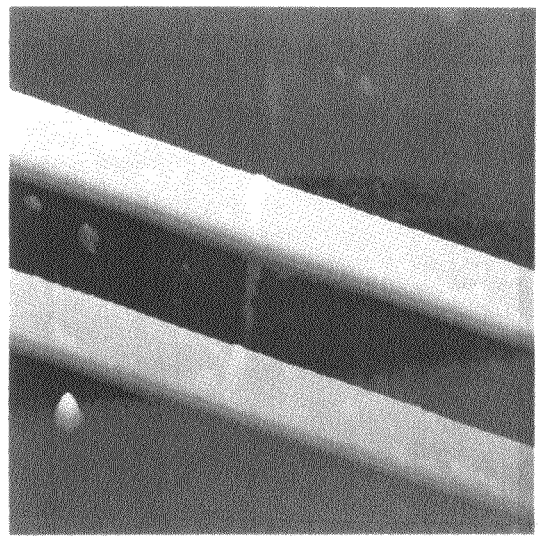
FIG. 10 is an AFM image of the device of the present invention actually constructed by using microtubule.
Figure 11:
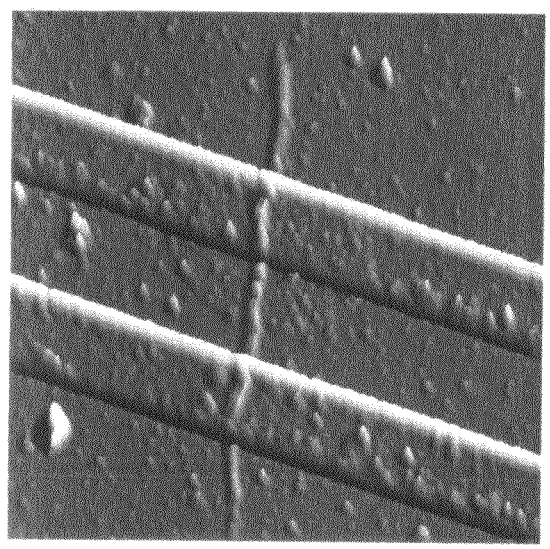
FIG. 11 is an AFM image of the device of the present invention actually constructed by using microtubule.

FIGS. 10 and 11 show the AFM images of the actually constructed device of the present invention based on a MT. As can be seen from the figures, a MT runs from top to bottom across two parallel electrodes of Au in the images.

Figure 12:
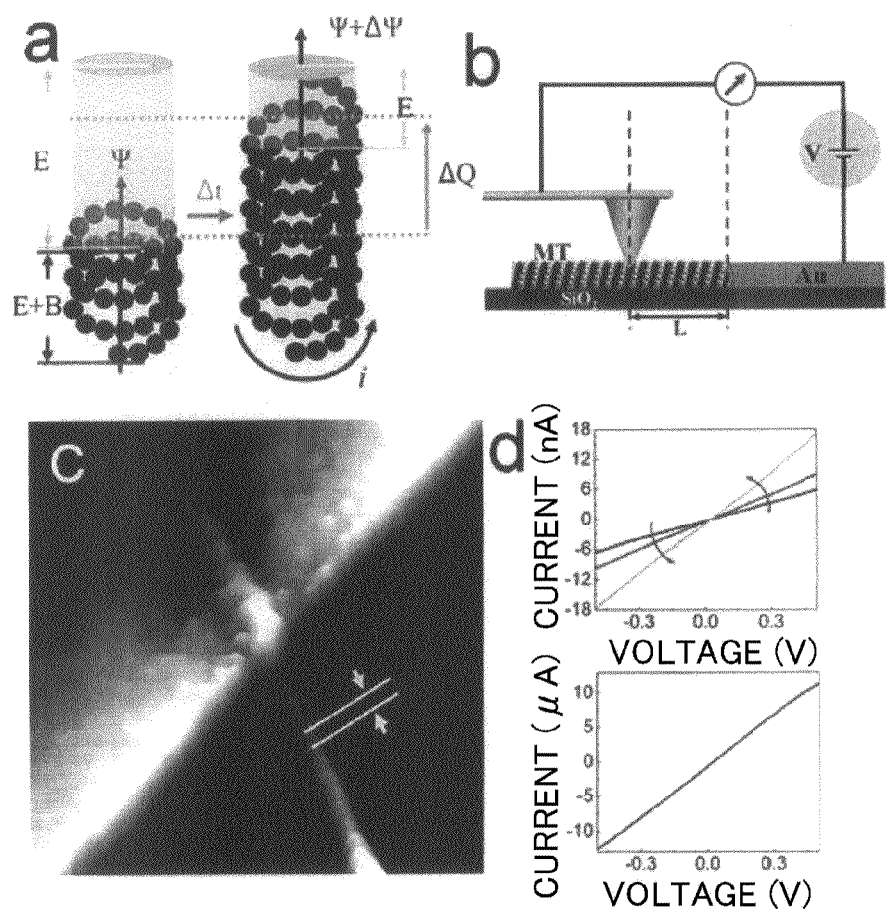
FIG. 12 includes a schematic diagram of the device of the present invention actually constructed by using microtubule, a schematic diagram of the arrangement for the measurement of the current-voltage characteristics, an AFM image of a portion of the device, and the results of the measurement.

In FIG. 12(a), the balls denote the capacitors that store charge to create a conducting solenoid. During the time interval $\Delta t$, these capacitors store $\Delta Q$ amount of charge and magnetic flux increases by $\Delta \phi$. For a fixed length of the device H, charged region is denoted as E+B, and uncharged region is E. FIG. 12(b) shows the experimental setup for the IV measurement of the device H. The voltage source and the current meter are replaced with a function generator and an oscilloscope for pulse-mode measurements. FIG. 12(c) shows an AFM image of a MT on a silicon substrate attached to the gold electrode on the edge. The two parallel white lines are drawn in this image to show the pitch of the spiral of the MT. The scanning was done in non-contact mode at a scan rate 0.3 Hz gain 1 at a set point −0.671 μm and with the tip amplitude of 1.5 μm. FIG. 12(d) shows the IV curves measured in the low conducting states for $V_{max}$ 0.5 V, 1V and 1.5 V applied bias at a scan rate of 0.01 V/sec (the upper graph). The IV in the high conducting state at $V_{max}$=2.5 V is shown enlarged in the lower graph.

[Critical Features of Microtubule]

Figure 13:
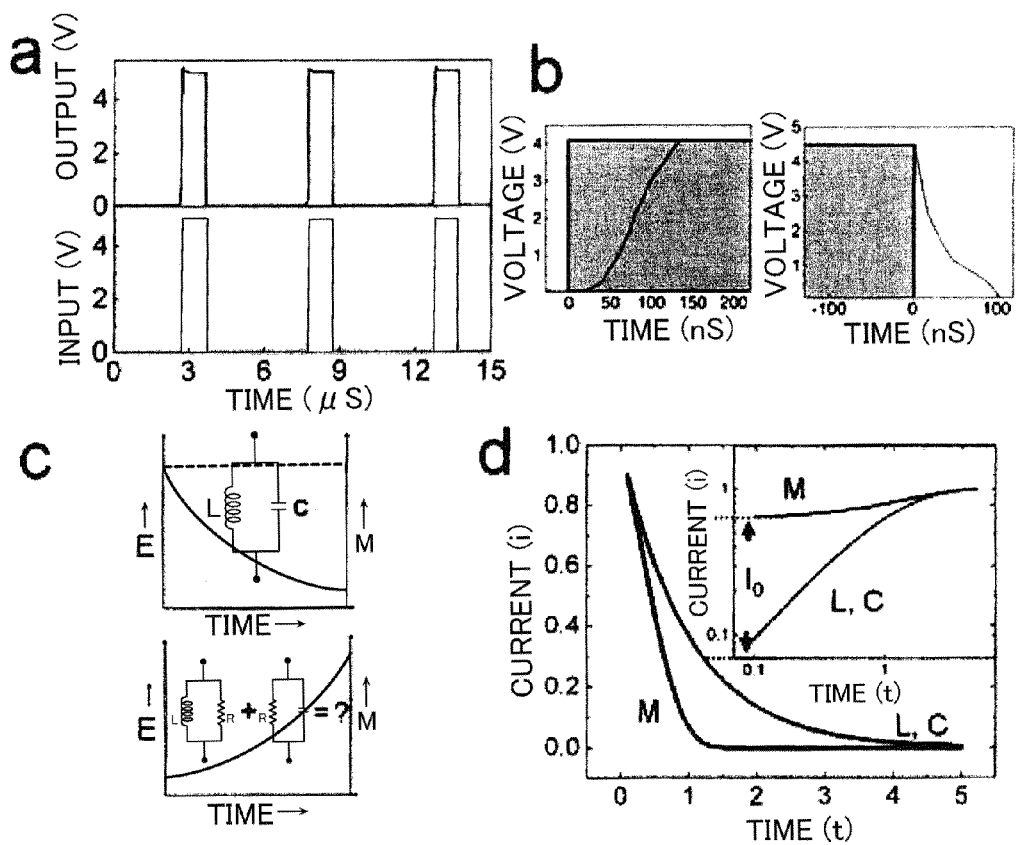
FIG. 13 is a drawing showing a response from the device of the present invention actually constructed by using microtubule and the change of the electric and magnetic energy within the device in time.

Lower section of FIG. 13(a) shows an array of rectangular input pulses of amplitude 5 V (>$V_{th}$) and width of 1 μsec at a frequency of 100 KHz, which array of the pulses generates a similar rectangular output array shown in the upper section; both input and output signal are captured against 47Ω resistor. The gap between two consecutive rectangular pulses is 4 μsec. The graph in the left side section of FIG. 13(b) shows the temporal growth of the output signal with respect to an input rectangular pulsed array of amplitude 5 V and a width of 250 ns at a frequency of 1 MHz (left). Similarly, the decay of that output signal as the pulse ends in the graph in the right hand section of FIG. 13(b). The upper and lower graphs in FIG. 13(c) show the temporal growth of electric and magnetic energy (E and M, respectively) in parallel LC coupled circuit and H, respectively. In the upper graph, the decaying curve indicates the electric energy E, the growing curve the magnetic energy M. On the other hand, these two curves in the lower graph for the device H look like a single line, since both the magnetic and the electrical energy increases with time. FIG. 13(d) is a graph comparing the temporal growth and decay rate comparison among H, L and C, wherein it is considered that L=R=C=1. If R=2, C=2, $i_H$ grows from present 63% to 98% of saturation current by the time L or C is 8% of their saturation.

[Special Features of MT as Fourth Circuit Element]

Figure 14:
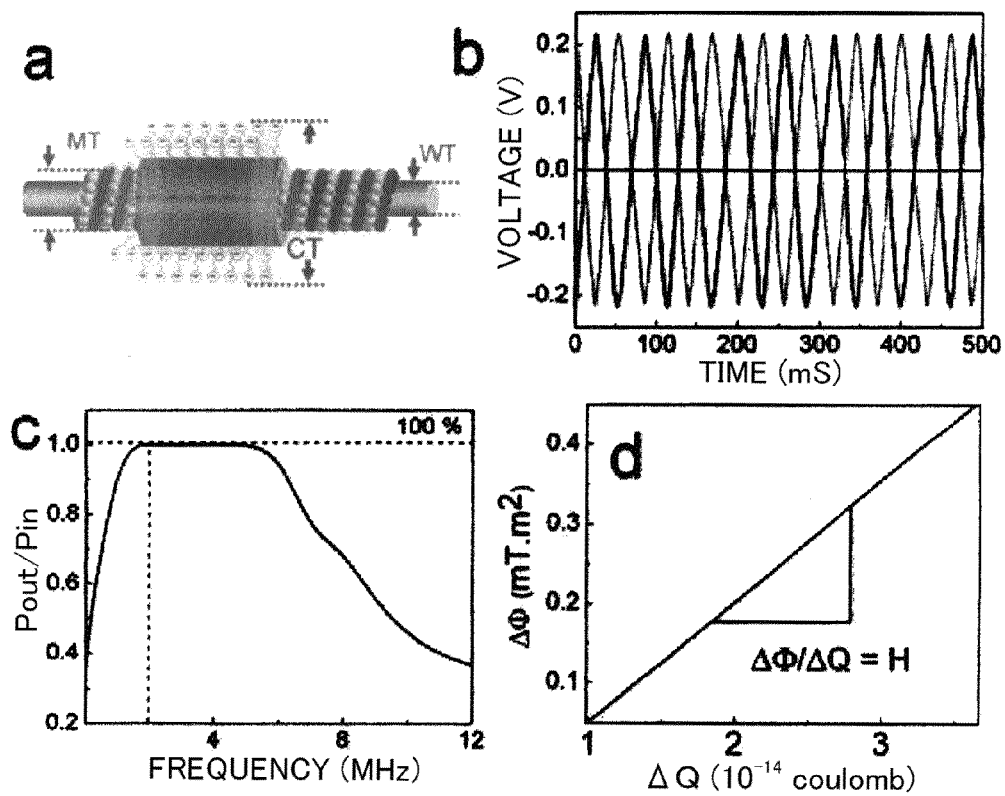
FIG. 14 includes a schematic diagram showing the structure of the microtubule used for the device of the present invention, a drawing showing the phase relation between the input and the output of the device actually constructed by using microtubule, a drawing showing the frequency characteristics of the input-output of this device, and a drawing showing the change in the magnetic flux according to the change in the amount of the electric charge of the device.

FIG. 14(a) is a schematic diagram of microtubule structure. Outer layer CT is C termini (terminated with a carbon hydride group (alkyl group) with negative charge at the end), middle layer MT is the tubulin assembly and the central WT is water column. FIG. 14(b) shows the input and the output signals of the device H. As can be seen in this graph, the output signal shows a 180° phase difference to an input AC signal of frequency 5 MHz and a peak-to-peak amplitude of 400 mV at a particular point on the Microtubule. FIG. 14(c) shows the ratio of output power delivered with respect to the input power. The ratio is varying with the change in frequency with the peak around 2 MHz. FIG. 14(d) shows the change in flux $\Delta \phi$ with the charge content $\Delta Q$. This change is plotted along length of the microtubules. The Q has been calculated using reported linear charge density 3.8 e/Å and hence $\Delta Q$ between two rings located at two different points on MT (alternately $\Delta Q$ is calculated as Q for one $\alpha \beta$~10e and one ring has 13 $\alpha \beta$ units). The slope or H (=$\Delta \phi / \Delta Q$) is 15e9, which is two orders higher than the resistance R.

[Applications of the Fourth Circuit Element]

Figure 15:
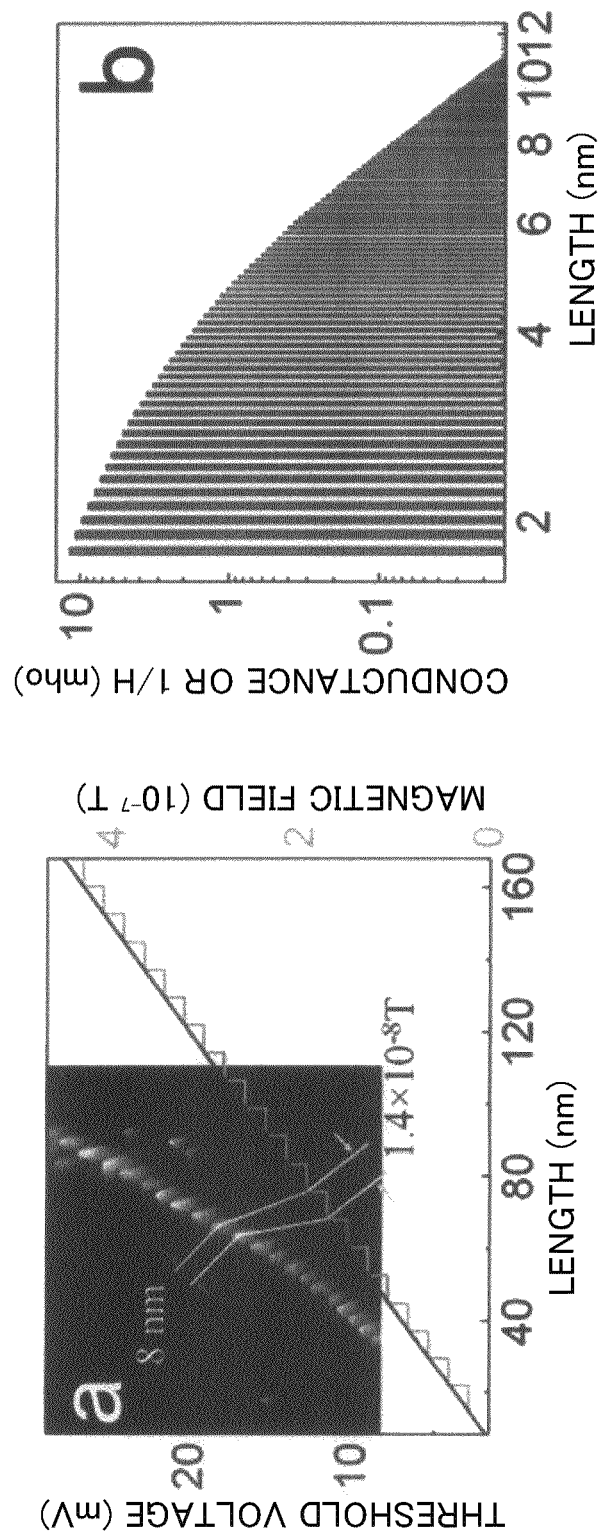
FIG. 15 is a drawing showing the change in the threshold voltage and the conductance along the length of the device of the present invention actually constructed by using microtubule.

FIG. 15(a) shows the variation of threshold voltage $V_{th}$ plotted along the length of the microtubule (the straight line). The current-voltage curve IVs were measured on top of individual rings starting from the gold electrode-MT junction to the far end to avoid complete charging of entire MT. The inset in FIG. 15(a) shows a microtubule. In this drawing, 21 brighter parts show the $\alpha \beta$ rings. The staircase-like change in magnetic field with $1.4 \times 10^{-8}$ T steps depicts the completion of $\alpha \beta$ rings with 8 nm period along the 168 nm MT chain at the Au-MT junction. FIG. 15(b) shows the conductance along the length of the microtubule at −0.5 V. The length and the conductance or $H^{-1}$ is plotted in the log-log scale.

EXPLANATION OF REFERENCE NUMERALS

101: unit capacitor
102: assembly of unit capacitors
305: disk-shaped present invention arranged in an integrated chip form
308: disk-shaped present invention arranged in a three-dimensional conical shape

The invention claimed is:

1. A spiral capacitor-inductor device comprising arrayed unit capacitors assembled in the form of loops along the length with a central axis thereof lying,
   wherein an input signal is applied from one end of said arrayed unit capacitors and an output is taken from the other end thereof,
   wherein electric charge stored in said unit capacitors increases or decreases in accordance with increment or decrement in applied bias across the device,
   wherein said increase or decrease in charge respectively increases or decreases current through said loop, which in turn changes magnetic flux generated in the device,
   wherein said unit capacitors are built using any one or combination of the materials selected from the group consisting of protein, organic dye, inorganic composites, nano-particles, dendrimers, organo-metallic complex, polymer, and bio-molecules which can reversibly store and release charge or energy in their structure when a predetermined condition is imposed externally, and
   wherein said unit capacitors are arranged in a structure that enables current flowing through a singular or a plurality of closed loops along the length of the device, said structure following any one of the two possible configurations A and B;
   A. an assembly of said unit capacitors wherein said unit capacitors physically move to change their relative locations orderly or disorderly along the length of the device and effectively trigger current to flow in a loop generating said magnetic flux; and
   B. an assembly of unit capacitors which form a defined spiral, disk shaped, conical or random geometry structure formed by weak interaction, covalent bonding, non-covalent bonding, metallic bonding or non-metallic bonding in such a way that said assembly enables flow of current from one unit capacitor to another neighboring one, eventually leading to a current flow in the singular or plural loops along the length of the device.

2. The spiral capacitor-inductor device as set forth in claim 1, wherein charging or discharging of said unit capacitors changes the conductivity of said singular or a plurality of closed loops which in turn increases or decreases said current flow through said loop thus changing said magnetic flux produced in the device.

3. The spiral capacitor-inductor device as set forth in claim 2, wherein charging or discharging of said material in said unit capacitors occurs orderly or disorderly in said one or a plurality of loops of the entire device, wherein loops in which said charging or discharging occurs are selected in the process orderly or randomly, wherein said magnetic flux changes only when a number of electronically charged loops changes or said current flowing through the device changes.

4. A spiral capacitor-inductor device comprising arrayed unit capacitors assembled in the form of loops along the length with a central axis thereof lying,
wherein an input signal is applied from one end of said arrayed unit capacitors and an output is taken from the other end thereof,
wherein electric charge stored in said unit capacitors increases or decreases in accordance with increment or decrement in applied bias across the device,
wherein said increase or decrease in charge respectively increases or decreases current through said loop, which in turn changes magnetic flux generated in the device, and
wherein current contribution due to charging and discharging of materials in said unit capacitor and contribution of current flowing through said loop together modulate the phase of an input signal in a particular condition to cause the output ac signal of the device to be 180° out of phase in positive or negative direction of the input signal applied between said one end and said other end.

5. The spiral capacitor-inductor device as set forth in claim 1, wherein material of said unit capacitors is microtubule containing αβ-heterodimer of tubulin, and wherein electrodes for input and output of the signal for said spiral capacitor-inductor device are formed at respective ends of said microtubule.

6. The spiral capacitor-inductor device as set forth in claim 1, wherein current contribution due to charging and discharging of materials in said unit capacitor and contribution of current flowing through said loop together modulate the phase of an input signal in a particular condition to cause the output ac signal of the device to be 180° out of phase in positive or negative direction of the input signal applied between said one end and said other end.

7. The spiral capacitor-inductor device as set forth in claim 2, wherein current contribution due to charging and discharging of materials in said unit capacitor and contribution of current flowing through said loop together modulate the phase of an input signal in a particular condition to cause the output ac signal of the device to be 180° out of phase in positive or negative direction of the input signal applied between said one end and said other end.

8. The spiral capacitor-inductor device as set forth in claim 3, wherein current contribution due to charging and discharging of materials in said unit capacitor and contribution of current flowing through said loop together modulate the phase of an input signal in a particular condition to cause the output ac signal of the device to be 180° out of phase in positive or negative direction of the input signal applied between said one end and said other end.

\* \* \* \* \*